(12) United States Patent
Yin

(10) Patent No.: US 9,496,342 B2
(45) Date of Patent: Nov. 15, 2016

(54) MOSFET STRUCTURE AND MANUFACTURING METHOD THEREOF

(71) Applicant: Institute of Microelectronics, Chinese Academy of Sciences, Beijing (CN)

(72) Inventor: Haizhou Yin, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 14/905,440

(22) PCT Filed: Oct. 22, 2013

(86) PCT No.: PCT/CN2013/085664
§ 371 (c)(1),
(2) Date: Jan. 15, 2016

(87) PCT Pub. No.: WO2015/051564
PCT Pub. Date: Apr. 16, 2015

(65) Prior Publication Data
US 2016/0172446 A1   Jun. 16, 2016

(30) Foreign Application Priority Data

Oct. 13, 2013   (CN) .......................... 2013 1 0476449

(51) Int. Cl.
*H01L 21/8234* (2006.01)
*H01L 29/10* (2006.01)
(Continued)

(52) U.S. Cl.
CPC ..... *H01L 29/1054* (2013.01); *H01L 21/02532* (2013.01); *H01L 21/308* (2013.01);
(Continued)

(58) Field of Classification Search
CPC .......... H01L 21/8232; H01L 21/8234; H01L 21/823412; H01L 21/02532; H01L 21/308
See application file for complete search history.

(56) References Cited

U.S. PATENT DOCUMENTS 7,416,931 B2 * 8/2008 Pei .................... H01L 29/66545
                                                       257/E21.317
7,928,427 B1 * 4/2011 Chang ................. H01L 21/8258
                                                       257/24
(Continued)

FOREIGN PATENT DOCUMENTS

CN     101615616 A     12/2009
CN     101819996 A     9/2010
(Continued)

OTHER PUBLICATIONS

International Search Report and Written Opinion mailed on Jul. 16, 2014 in International Application PCT/CN2013/085664.

*Primary Examiner* — Michele Fan
(74) *Attorney, Agent, or Firm* — Pillsbury Winthrop Shaw Pittman LLP

(57) ABSTRACT

A MOSFET and a method for manufacturing the same are disclosed. The method comprises: a. providing a substrate (100), a dummy gate structure (200), a epitaxial protection layer (101) and a sacrificial spacer (205); b. covering the dummy gate structure (200) and the substrate (100) on one side thereof by a mask layer, and forming a vacancy (102) in the substrate; c. growing a semiconductor layer (300) on the semiconductor structure to fill in the vacancy (102); d. removing the epitaxial protection layer (101) and the sacrificial spacer (205), and sequentially forming source/drain extension regions, a spacer (201), source/drain regions, and an interlayer dielectric layer (500); and e. removing the dummy gate structure (200) to form a dummy gate vacancy, and forming a gate stack in the dummy gate vacancy. In the MOSFET structure of the present disclosure, negative effects of DIBL on device performance can be effectively reduced.

11 Claims, 2 Drawing Sheets

(51) Int. Cl.
  *H01L 29/66* (2006.01)
  *H01L 29/78* (2006.01)
  *H01L 21/02* (2006.01)
  *H01L 21/308* (2006.01)
  *H01L 29/08* (2006.01)
  *H01L 29/165* (2006.01)

(52) U.S. Cl.
  CPC ... *H01L21/8234* (2013.01); *H01L 21/823412* (2013.01); *H01L 29/0847* (2013.01); *H01L 29/165* (2013.01); *H01L 29/6653* (2013.01); *H01L 29/66545* (2013.01); *H01L 29/78* (2013.01); *H01L 29/7833* (2013.01)

(56) References Cited

U.S. PATENT DOCUMENTS

| | | | |
|---|---|---|---|
| 8,455,858 B2 | 6/2013 | Wang et al. | |
| 8,828,813 B2 * | 9/2014 | Huang | H01L 29/0847 257/E21.444 |
| 2008/0102571 A1 * | 5/2008 | Pan | H01L 29/66545 438/197 |
| 2008/0277740 A1 * | 11/2008 | Tateshita | H01L 21/28123 257/396 |
| 2009/0026553 A1 * | 1/2009 | Bhuwalka | H01L 29/66356 257/402 |
| 2009/0194816 A1 * | 8/2009 | Onoda | H01L 21/82380 257/369 |
| 2009/0224287 A1 * | 9/2009 | Shin | H01L 21/82380 257/192 |
| 2010/0059737 A1 * | 3/2010 | Bhuwalka | H01L 21/26586 257/28 |
| 2011/0042750 A1 | 2/2011 | Chuang et al. | |
| 2011/0042758 A1 * | 2/2011 | Kikuchi | H01L 29/1054 257/408 |
| 2011/0073909 A1 * | 3/2011 | Chang | H01L 29/66356 257/192 |
| 2011/0195550 A1 * | 8/2011 | Chang | H01L 21/28079 438/230 |
| 2011/0284968 A1 * | 11/2011 | Lee | H01L 29/66545 257/368 |
| 2012/0012938 A1 * | 1/2012 | Chen | H01L 21/82380 257/369 |
| 2012/0043624 A1 * | 2/2012 | Liang | H01L 21/28123 257/410 |
| 2012/0100684 A1 * | 4/2012 | Min | H01L 21/28185 438/287 |
| 2012/0104498 A1 * | 5/2012 | Majumdar | H01L 29/66545 257/351 |
| 2013/0087833 A1 | 4/2013 | Wang | |
| 2013/0113027 A1 * | 5/2013 | Chiang | H01L 21/28518 257/288 |
| 2013/0181301 A1 * | 7/2013 | Witters | H01L 29/66477 257/408 |
| 2013/0248927 A1 * | 9/2013 | Wu | H01L 29/78 257/190 |
| 2013/0277686 A1 * | 10/2013 | Liu | H01L 29/6653 257/77 |
| 2014/0035045 A1 * | 2/2014 | Alptekin | H01L 29/66545 257/368 |
| 2014/0110798 A1 * | 4/2014 | Cai | H01L 29/78 257/410 |
| 2014/0145242 A1 * | 5/2014 | Huang | H01L 29/78 257/192 |
| 2015/0024561 A1 * | 1/2015 | Li | H01L 21/28123 438/222 |

FOREIGN PATENT DOCUMENTS

| | | |
|---|---|---|
| CN | 102569391 A | 7/2012 |
| CN | 103035712 A | 4/2013 |

* cited by examiner

MOSFET STRUCTURE AND MANUFACTURING METHOD THEREOF

CROSS REFERENCE TO RELATED APPLICATION

This application is a national stage application, filed under 35 U.S.C. §371, of PCT Application No. PCT/CN2013/085664, filed on Oct. 22, 2013, entitled "MOSFET STRUCTURE AND MANUFACTURING METHOD THEREOF", which claimed priority to Chinese Application No. 201310476449.0, filed on Oct. 13, 2013, all of which are hereby incorporated by reference in their entirety.

TECHNICAL FIELD

The present disclosure relates to a Metal Oxide Semiconductor Field Effect Transistor (MOSFET) structure and a method for manufacturing the same. Specifically, the present disclosure relates to a MOSFET structure having reduced leakage current in off-state and a method for manufacturing the same.

BACKGROUND

In a MOSFET structure, it is desirable to have a channel as narrow as possible to enhance control over the channel by the gate, so as to suppress the short channel effects. However, when the channel thickness is smaller than 10 nm, device performance may be severely influenced due to reduction of carrier mobility with the decrease of the channel thickness. Particularly, the channel near the source end may be much more influenced. While at the drain end, the channel thickness plays a minor role on the carrier mobility because of high field saturation.

Drain Induction Barrier Lower (DIBL) is an undesirable effect in a short channel device. when the channel length decreases, the source-drain voltage increases such that the depletion regions in PN junctions of source/drain regions become closer. As a result, the electric line in the channel may traverse from the drain region to the source region and the barrier height at the source decreases, so that number of the carrier from the source to the channel increases and the current at the drain end increases. With further decrease of the channel length, DIBL has a much severe impact such that the threshold voltage of the transistor decreases, voltage gain of the device is reduced, and integration level of Very Large Scale Integtated Circuit is restricted.

It has been an urgent challenge to be solved for providing a method for manufacturing a MOS transistor with effectively reduced DIBL current.

SUMMARY OF INVENTION

The present disclosure provides a method for manufacturing a MOSFET with effectively reduced DIBL current, which can suppress short channel effects and improve device performance. Specifically, the present disclosure provides a method comprising:

a. providing a substrate, a dummy gate structure, a epitaxial protection layer and a sacrificial spacer;

b. covering the dummy gate structure and the substrate on one side thereof a mask layer, and forming a vacancy in the substrate;

c. growing a semiconductor layer on the semiconductor structure to fill in the vacancy;

d. removing the epitaxial protection layer and the sacrificial spacer, and sequentially forming source/drain extension regions, a spacer, source/drain regions, and an interlayer dielectric layer; and g. removing the dummy gate structure to form a dummy gate vacancy, and sequentially depositing a gate dielectric layer, a work function adjusting layer and a metal gate layer in the dummy gate vacancy.

Preferably, the vacancy is formed in the substrate on the source side, and the vacancy is formed by combination of anisotropic etching and isotropic etching.

The overlapping length L between the vacancy and the dummy gate structure is smaller than or equal to the width of the dummy gate structure.

The semiconductor layer (300) has a gradually increased band gap from the source end to the drain end.

The semiconductor layer is formed of silicon germanium.

The the silicon in the silicon germanium of the semiconductor layer has a gradually increased percentage from the source end to the drain end.

Accordingly, the present disclosure provides a MOSFET structure, comprising:

a substrate;

a gate stack formed on the substrate;

source/drain regions formed in the substrate on both sides of the gate stack;

an interlayer dielectric layer covering the source/drain regions; and a semiconductor layer under the gate stack and in the substrate on one side thereof, wherein the semiconductor layer is formed of a material having a gradually increased band gap along the channel from the source to the drain.

The semiconductor layer has a length L under the gate stack equal to or smaller than the width of the gate stack.

According to the semiconductor structure in the present disclosure, the silicon for the channel is replaced by silicon germanium having a smaller band gap, and the material for the channel has a gradually increased band gap from the source to the drain by adjusting the percentage of the silicon germanium in the material, such that the height difference between the barrier at the source and the barrier at the drain is effectively increased, and the leakage current induced by DIBL is decreased. Further, because the semiconductor material at the drain has a band gap larger than that of the semiconductor material at the source, leakage current induced by DIBL can be suppressed. Therefore, the leakage current of the device can be reduced by means of the semiconductor structure of the present disclosure, and device performance can be enhanced.

DESCRIPTION OF DRAWINGS

After reading the following detailed description of the non-limiting embodiments in connection with the attached drawings, other features, objectives and advantages of the present disclosure will be more apparent.

In the attached drawings, the same or similar reference numbers donate the same or similar elements.

DETAILED DESCRIPTION

In the following, in order to make objectives, technical solutions and advantages of the present disclosure more clearer, embodiments of the present disclosure will be described in detail in connection with the attached drawings.

Hereinafter, embodiments of the present disclosure are described. Examples of the embodiments are shown in the attached drawings. The same or similar reference numbers denote the same or similar elements or elements having the same or similar function throughout the drawings. Embodiments described with reference to the drawings are illustrative only, and are intended to interpret the invention rather than limiting the invention.

Figure 6:
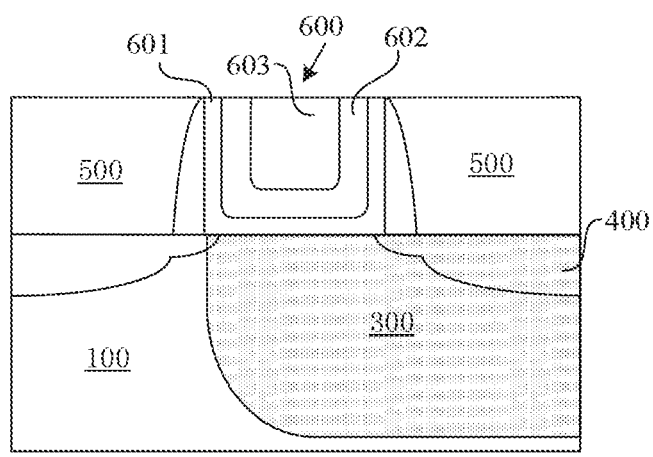

As shown in FIG. 6, a MOSFET structure is provided in the disclosure, comprising: a substrate 100; a gate stack 600 on the substrate 100; source/drain regions 400 formed in the substrate on both sides of the gate stack 600; and a semiconductor layer 300 formed under the gate stack 600 and on one side thereof in the substrate 100, wherein the semiconductor layer 300 is formed of a material having a gradually increased band gap along the channel from the source to the drain.

The semiconductor channel is located on a surface of the substrate, and may be preferably made of single crystalline silicon with a thickness of about 5-20 nm. The channel may be lightly doped or undoped. In a case where the channel is doped, the channel may have a doping type opposite to that of the source/drain regions.

The source/drain regions are located on both sides of the gate stack 600 in the semiconductor layer on the substrate. The source region has a thickness larger than that of the drain region. The portion of the channel near the source region has a thickness larger than that near the drain region, and may have a thickness of about 10-60 nm.

The semiconductor layer 300 is located under the gate stack 600, and has a length L equal to or smaller than the width of the gate stack 600. The material for the substrate is replaced by a material having a gradually changed band gap. Specifically, the silicon for the channel is replaced by silicon germanium having a smaller band gap, and the material for the channel has a gradually increased band gap from the source to the drain by adjusting the percentage of the silicon germanium in the material, such that the height difference between the barrier at the source and the barrier at the drain is effectively increased, and the leakage current induced by DIBL is decreased. Further, because the semiconductor material at the drain has a band gap larger than that of the semiconductor material at the source, leakage current induced by DIBL can be suppressed.

In the following, the manufacturing method is described in connection with the attached drawings. It should be noted that the drawings in embodiments of the present disclosure are illustrative only, and are not drawn to scale.

Figure 1:
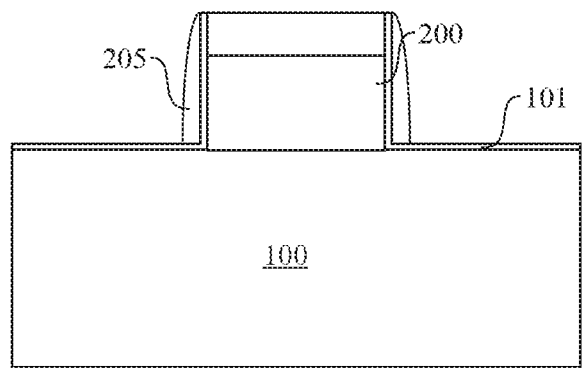
FIGS. 1-6 are cross-section diagrams of structures in stages of a method for manufacturing a MOSFET according to an embodiment of the present disclosure.

As shown in FIG. 1, a semiconductor substrate 100 is provided, and a dummy gate structure 200 is formed on the substrate 100. The dummy gate structure 200 may be a single-layer structure, or may be a multi-layer structure. The dummy gate structure 200 may be made of polymer materials, amorphous silicon, polysilicon or TiN, and may have a thickness of about 10-200 nm. In the present embodiment, the dummy gate structure may comprise polysilicon and silicon dioxide. Specifically, polysilicon may be filled into the gate vacancy by Chemical Vapor Deposition (CVD) with a height slightly lower than the spacer by 10-20 nm. Then, a silicon dioxide layer is formed on the polysilicon layer by, for example, epitaxially growing, oxidation or CVD, etc. Next, the dummy gate structure is processed by lithography and etching in conventional CMOS processes to form a gate electrode pattern. The channel region of the transistor is formed by the portion of the Silicon Germanium channel layer 101 covered by the gate dielectric layer. It should be noted that if not stated otherwise, the deposition of various dielectric materials in the present embodiment may be formed by the method for forming the gate dielectric layer described above, and may be omitted here.

Next, an epitaxial protection layer 101 is formed on the semiconductor structure to cover the substrate 100 and the dummy gate structure 200. The semiconductor structure on the drain side is protected by the epitaxial protection layer 101 from growing materials in subsequent epitaxial growing. Specifically, in the present disclosure, the epitaxial protection layer 101 is formed of silicon oxide with a thickness of about 5-20 nm.

Next, a sacrificial spacer 205 is formed on sidewalls of the gate stack to isolate the gate electrode. Specifically, a sacrificial spacer dielectric layer of silicon nitride with a thickness of about 40-80 nm may be deposited by LPCVD. Then, the sacrificial spacer 205 of silicon nitride with a thickness of about 35-75 nm is formed on both sides of the gate electrode by an etching back process. The sacrificial spacer 205 may also be formed of silicon oxide, silicon oxynitride, silicon carbide or combinations thereof, and/or other materials as appropriate. The sacrificial spacer 205 may have a multi-layer structure. The first spacer 205 may be formed by processes such as deposition and etching, and may have a thickness of about 10-100 nm, for example, 30 nm, 50 nm or 80 nm.

FIG. 1 shows the cross-section views of the finished semiconductor structure after the above-mentioned processes is shown in.

Figure 2:
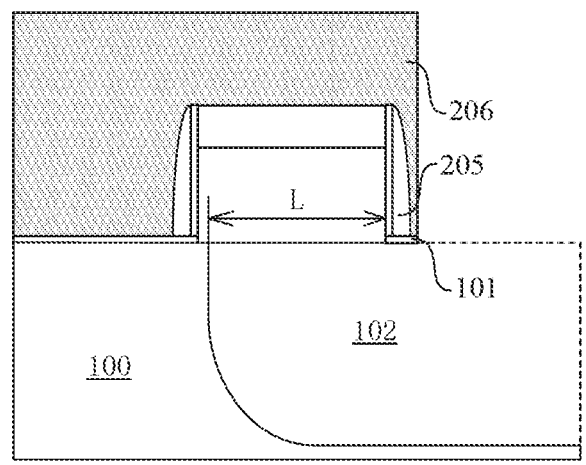

Next, the dummy gate structure and the substrate on one side thereof are covered by a mask or photo resist layer 206 to form a vacancy 102 in the substrate, as shown in FIG. 2. Specifically, the semiconductor layer is covered by a photo resist layer 206, and the photo resist layer 206 on the semiconductor at the source side is removed by processes including development, exposure, etc., so as to expose the substrate 100. Next, the semiconductor structure is etched to form a vacancy 102. The vacancy 102 is located in the substrate on the source side, and have an overlapping length L with the dummy gate structure 200 smaller than or equal to the width of the dummy gate structure. The vacancy is formed by combination of anisotropic etching and isotropic etching. In the present embodiment, because the vacancy is located in the semiconductor structure on the source side, the material of the channel near the drain has a band gap larger than that of the material of the channel near the source, which can effectively reduce the leakage current induced by the GIDL.

Figure 3:
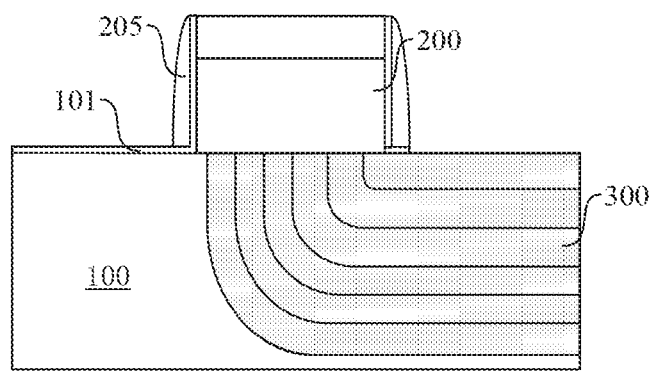

Next, a semiconductor layer 300 is gradually grown on the semiconductor structure to fill in the vacancy 102, as shown in FIG. 3. The semiconductor layer 300 is formed of silicon germanium, and has a gradually increased band gap from the source to the drain, which means the silicon in the silicon germanium has a gradually increased percentage. Specifically, silicon germanium is gradually grown in the vacancy 102 by selectively epitaxial growing. The grown silicon germanium can only exist in the vacancy 102 and there is no silicon germanium on the drain region and the dummy gate structure of the semiconductor structure because of the epitaxial protection layer 101. The band gap of the material for the channel can be controlled by adjusting the layer number and percentage of the silicon germanium to achieve the desired energy band structure. Because the silicon in the semiconductor material at the drain end has a gradually increased percentage, the semiconductor layer 300 has a gradually increased band gap from the source end to the drain end, which can effectively increase the height difference between the barrier at the drain and the barrier at the source, and reduce the leakage current induced by DIBL.

Figure 4:
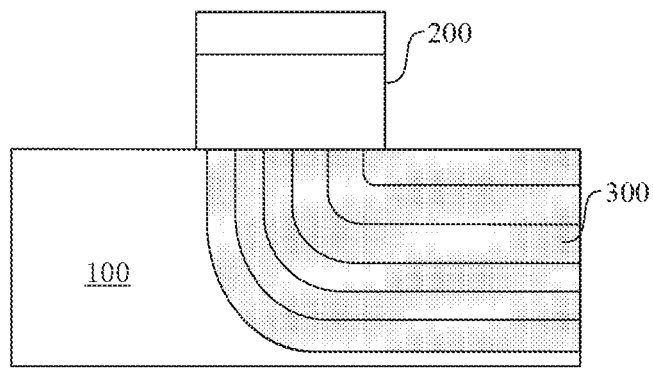

Next, the epitaxial protection layer 101 and the sacrificial spacer 205 on the semiconductor structure are removed to expose the dummy gate structure 200, as shown in FIG. 4. Next, the substrate on both sides of the dummy gate structure 200 may be doped to form source/drain extension regions. Halo implantation may also be performed to form halo implantation regions. The dopants for the source/drain extension regions may be the same as that of the device, and the dopants for halo implantation may be opposite to that of the device.

Optionally, a spacer 201 is formed on sidewalls of the gate stack to isolate the gate electrode. Specifically, a spacer dielectric layer of silicon nitride with a thickness of about 40-80 nm may be deposited by LPCVD. Then, the spacer 201 of silicon nitride with a thickness of about 35-75 nm is formed on both sides of the gate electrode by an etching back process. The spacer 201 may also be formed of silicon oxide, silicon oxynitride, silicon carbide or combinations thereof, and/or other materials as appropriate. The spacer 201 may have a multi-layer structure. The spacer 201 may be formed by processes such as deposition and etching, and may have a thickness of about 10-100 nm, for example, 30 nm, 50 nm or 80 nm.

Figure 5:
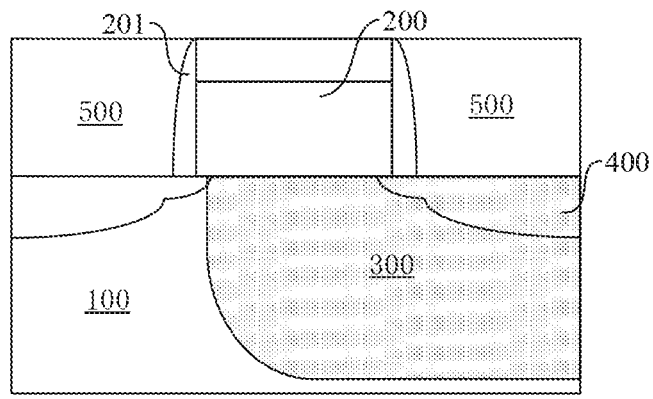

Next, a dielectric layer of silicon dioxide with a thickness of about 10-35 nm may be deposited on the semiconductor structure. Then, ion implantation may be performed to the source/drain regions with the dielectric layer as a buffer layer. For p-type crystal, the dopants may be B, $BF_2$, In, or Ga. For n-type crystal, the dopants may be P, As, or Sb. The doping concentration may be $5e10^{19}$ $cm^{-3}$-$1e10^{20}$ $cm^{-3}$. After the doping of the source/drain regions, an interlayer dielectric layer 500 is formed on the semiconductor structure. In the present embodiment, the interlayer dielectric layer 500 may be formed of silicon oxide. The semiconductor structure after depositing the interlayer dielectric layer 500 is shown in FIG. 5.

Next, the dummy gate structure 200 is removed to form a dummy gate vacancy. The dummy gate structure 200 may be removed by wet etching and/or dry etching. In one embodiment, plasma etching is performed.

Next, as shown in FIG. 6, a gate stack 600 is formed in the dummy gate vacancy. The gate stack may be a metal gate, or a composite gate of metal/polysilicon with silicide formed on the polysilicon.

Specifically, a gate dielectric layer 601 is formed in the dummy gate vacancy. Then, a work function adjusting layer 602 is deposited, and a metal gate layer 603 is formed on the work function adjusting layer. The gate dielectric layer 601 may be a thermal oxidation layer including silicon oxide and silicon oxynitride, or may be high-K dielectrics, such as one of HfAlON, HfSiAlON, HfTaAlON, HfTiAlON, HfON, HfSiON, HfTaON, HfTiON, $Al_2O_3$, $La_2O_3$, $ZrO_2$ and LaAlO, or combinations thereof, and the gate dielectric layer 601 may have a thickness of about 1-10 nm, such as 3 nm, 5 nm or 8 nm. The gate dielectric layer 601 may be formed by thermal oxidation, CVD or Atomic Layer Deposition (ALD).

The work function adjusting layer may be formed of TiN, TaN, etc., and may have a thickness of about 3-15 nm. The metal gate layer may be a single-layer or multi-layer structure. And the metal gate layer may be formed of one of TaN, TaC, TiN, TaAlN, TiAlN, MoAlN, TaTbN, TaErN, TaYbN, TaSiN, HfSiN, MoSiN, $RuTa_x$, and $NiTa_x$, or combinations.

The metal gate layer may have a thickness of about 10-40 nm, for example, 20 nm or 30 nm.

Finally, a conventional CMOS back-end process may be performed, including depositing a passive layer, forming a contact hole and metalization, so as to achieve the super thin SOI MOS transistor.

In the present disclosure, the silicon for the channel is replaced by silicon germanium having a larger band gap, and the material for the channel has a gradually decreased band gap from the source to the drain by adjusting the percentage of the silicon germanium in the material, such that the height difference between the barrier at the source and the barrier at the drain is effectively increased, and the leakage current induced by DIBL is decreased. In the present embodiment, because the vacancy is located in the semiconductor structure on the source side, the material of the channel near the drain has a band gap larger than that of the material of the channel near the source, which can effectively reduce the leakage current induced by the GIDL. Therefore, the leakage current of the device can be reduced by means of the semiconductor structure of the present disclosure, and device performance can be enhanced.

Therefore, the leakage current of the device can be reduced by means of the semiconductor structure of the present disclosure, and device performance can be enhanced.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

The invention claimed is:

1. A method for manufacturing a MOSFET, comprising:
   a. providing a substrate, a dummy gate structure, a epitaxial protection layer and a sacrificial spacer;
   b. covering the dummy gate structure and the substrate on one side thereof by a mask layer, and forming a vacancy in the substrate;
   c. growing a semiconductor layer to fill in the vacancy;
   d. removing the epitaxial protection layer and the sacrificial spacer, and sequentially forming source/drain extension regions, a spacer, source/drain regions, and an interlayer dielectric layer; and
   e. removing the dummy gate structure to form a dummy gate vacancy, and forming a gate stack in the dummy gate vacancy.

2. The method of claim 1, wherein the vacancy is located in the substrate on the source side.

3. The method of claim 2, wherein the vacancy is formed by combination of anisotropic etching and isotropic etching.

4. The method of claim 2, wherein an overlapping length L between the vacancy and the dummy gate structure is smaller than or equal to the width of the dummy gate structure.

5. The method of claim 1, wherein the vacancy is formed by combination of anisotropic etching and isotropic etching.

6. The method of claim 5, wherein an overlapping length L between the vacancy and the dummy gate structure is smaller than or equal to the width of the dummy gate structure.

7. The method of claim 1, wherein an overlapping length L between the vacancy and the dummy gate structure is smaller than or equal to the width of the dummy gate structure.

8. The method or claim 1, wherein the semiconductor layer has a gradually increased band gap from the source end to the drain end.

9. The method of claim 8, wherein the semiconductor layer is formed of silicon germanium.

10. The method of claim 1, wherein the semiconductor layer is formed of silicon germanium.

11. The method of claim 10, wherein the silicon in the silicon germanium of the semiconductor layer has a gradually increased percentage from the source and to the drain end.

* * * * *